United States Patent
Griese et al.

(10) Patent No.: US 7,173,192 B1
(45) Date of Patent: Feb. 6, 2007

(54) POSITION FIXING IN PRINTED CIRCUIT BOARDS

(75) Inventors: Elmar Griese, Olpe (DE); Andreas Himmler, Paderborn (DE)

(73) Assignee: Siemens Aktiengesellschaft, Munich (DE)

( * ) Notice: Subject to any disclaimer, the term of this patent is extended or adjusted under 35 U.S.C. 154(b) by 358 days.

(21) Appl. No.: 10/398,569

(22) PCT Filed: Oct. 9, 2000

(86) PCT No.: PCT/DE00/03541

§ 371 (c)(1),
(2), (4) Date: Oct. 16, 2003

(87) PCT Pub. No.: WO02/31562

PCT Pub. Date: Apr. 18, 2002

(51) Int. Cl.
*H05K 1/00* (2006.01)

(52) U.S. Cl. .................. 174/250; 361/760; 361/761
(58) Field of Classification Search .......... 174/250, 174/260; 257/432, 431, 433, 434; 385/14, 385/15, 52, 129, 131; 361/783; 438/64, 438/65, 69

See application file for complete search history.

(56) References Cited

U.S. PATENT DOCUMENTS 5,611,006 A * 3/1997 Tabuchi ................... 385/14
5,617,297 A * 4/1997 Lo et al. .................. 361/737

OTHER PUBLICATIONS

T. Satake et al, "MT Multifiber Connectors and New Applications", Proceedings of the 44th Electronic Components and Technology Conference, IEEE, New York, 1994, pp. 994-999.
A. Picard et al., High precision LIGA structures for optical fibre-in-board technology, EuPac '96, Lectures and Conference Contributions, DVS Verlag Düsseldorf, 1995, pp. 77-80.

* cited by examiner

*Primary Examiner*—Dean A. Reichard
*Assistant Examiner*—Ivan Carpio
(74) *Attorney, Agent, or Firm*—Morrison & Foerster LLP

(57) ABSTRACT

The invention relates to a position-fixing arrangement for use in printed circuit boards, preferably for mechanically determining the position of optical couplers. According to the invention, hollow cylinders are contained in a printed circuit board, parallel to the surface of the same. Said hollow cylinders are opened with a slit that is cut in from the surface and the inner wall of the cylinders fixes positioning pins of the couplers in place. The invention also relates to a corresponding production process.

5 Claims, 4 Drawing Sheets

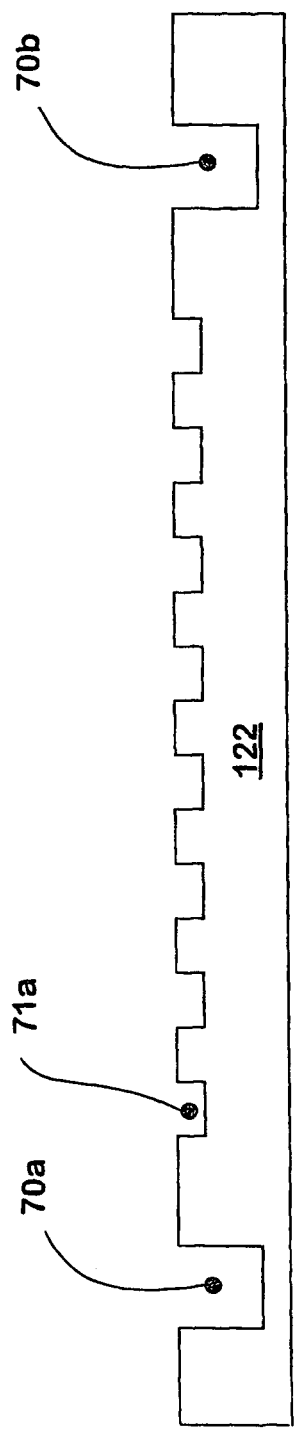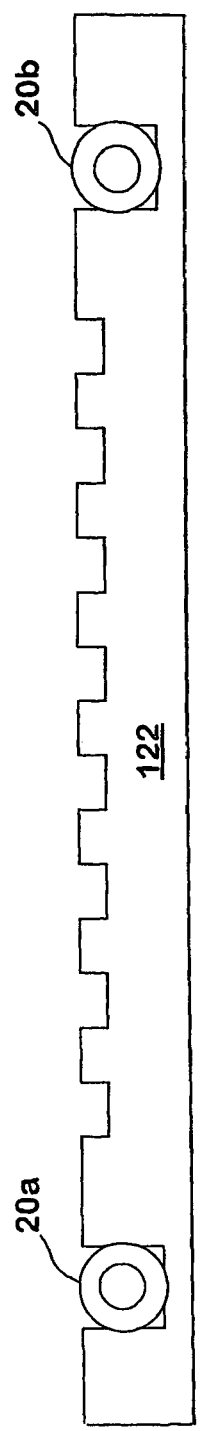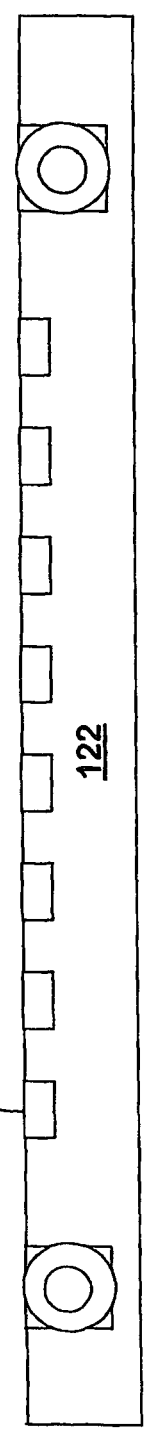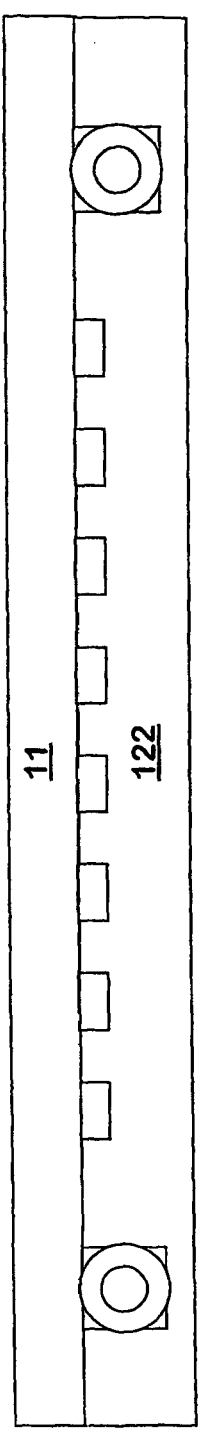

POSITION FIXING IN PRINTED CIRCUIT BOARDS

CLAIM FOR PRIORITY

This application claims priority to International Application No. PCT/DE00/03541 which was published in the German language on Apr. 18, 2002.

TECHNICAL FIELD OF THE INVENTION

The invention relates to a position-fixing arrangement in printed circuit boards, in particular for optical couplers.

BACKGROUND OF THE INVENTION

Until now, electrical connections were the main connections used in printed circuit boards. Electrical connections are produced in and on insulating layers according to a technologically well-controlled process and interconnected via soldered and plug connections. During this process, solder terminals are used to interconnect integrated circuits in particular, which are mounted in a housing, which in turn has contact points corresponding to contact points on the printed circuit board. Although initially a raster of 1/10 inch, approx. 2.5 mm, was customary, it has since become possible to achieve a finer raster using precision conductor technology, without significantly altering the order of magnitude. When positioning components on the printed circuit board, positioning accuracies in the order of 1/10 mm are therefore satisfactory. Moreover, as the connection is made via soldering and the solder used during the soldering phase is liquid and pliable, it is easily possible to even out any small deviations, with the surface tension of the solder also being used for precision correction work. In the case of connectors with electrical contacts, tolerances are evened out thanks to resilient contacts. In both cases, the contact surfaces can be as large as required, because it is possible to create a contact on any part of the contact surface.

With the availability of high-speed electrooptical converters, it is desirable to be able to use optical connections as well on a printed circuit board, as these connections exhibit a greater fault tolerance at very large bandwidths. However, because the optical waveguides to be used have cross-sectional dimensions in the order of 100 μm, the electrooptical converter must be positioned on the end of the optical waveguide with an accuracy of approximately 10 μm. To this end, connectors known in particular as mechanically-transferable (MT) connectors were created for fiber-optic connections, as described for example in the article by T. Stake et al, MT multifiber connectors and new applications, pp 994–999 of the 1994 Proceedings 44$^{th}$ Electronic Components and Technology Conference, IEEE New York 1994. In this process, high-precision hollow cylinders with an internal diameter of 0.7 mm are used in these MT connectors, and corresponding pins are secured into these cylinders, in order to laterally fix the position of both connector parts to be connected. To this end, optical cables and connectors to be added to the optical cables can be produced using optoelectronic converters, with the lateral positioning of the optical fibers and/or optoelectronic converters being fixed during the production of the connector thanks to corresponding mechanical precision.

One solution for coupling optical fibers embedded in a printed circuit board is described in the article "High Precision LIGA structures for optical fibre-in-board technology" by A. Picard et al, pp 77–80 of conference report EuPac '96, DVS Verlag, Düsseldorf 1996. According to this solution, optical connections that are embedded in a printed circuit board are integrated with a connector mounted on the surface. A costly process is involved in order to mount this connector, with the bared fibers having to be routed to the surface at an angle of 14°, sectioned, inserted into the connector, polished at the end face and glued in place. Apart from the high production costs, this solution assumes that printed circuit boards with inserted leads are used, so that the optical fibers can be laid using the same device. However, it is desirable to have a solution which enables printed circuit boards to be produced using printed circuit technology. It should be possible for the optical waveguides to be interconnected just as easily as for the electrical contact surfaces, without having to prepare each individual waveguide. To this end, an optoelectronic converter must be coupled to optical waveguides embedded in a printed circuit board in such a way that the lateral deviation is clearly less than the cross-sectional dimensions of the waveguides.

The solution is based on the consideration that it is not necessary to route the optical waveguides to the surface. Rather these optical waveguides can be completely "buried" in the printed circuit board. Immediately prior to assembly, slits are milled in, which bare the optical waveguides and the embedded reference elements parallel thereto. Optoelectronic couplers, which at the surface are also adjacent to corresponding solder terminals, are then inserted into the milled slits. It is preferable to use hollow cylinders as reference elements, into which suitable pins on the couplers are secured, as described in more detail in the exemplary embodiment.

SUMMARY OF THE INVENTION

The invention relates to a position-fixing arrangement for use in printed circuit boards, preferably for mechanically determining the position of optical couplers, hollow cylinders being contained in a printed circuit board, parallel to the surface of the same. The hollow cylinders are opened with a slit that is milled in from the surface and the inner wall of the cylinders fixes positioning pins of the couplers in place. The invention also relates to a corresponding production process.

BRIEF DESCRIPTION OF THE DRAWINGS

Further characteristics and advantages of the invention will now be shown in the following description, which explains the invention with reference to exemplary embodiments and in conjunction with the attached drawings, in which:

FIGS. 7 to 10 show a sectional view of a printed circuit board at different phases of production of the optical conductors.

DETAILED DESCRIPTION OF THE INVENTION

Figure 1:
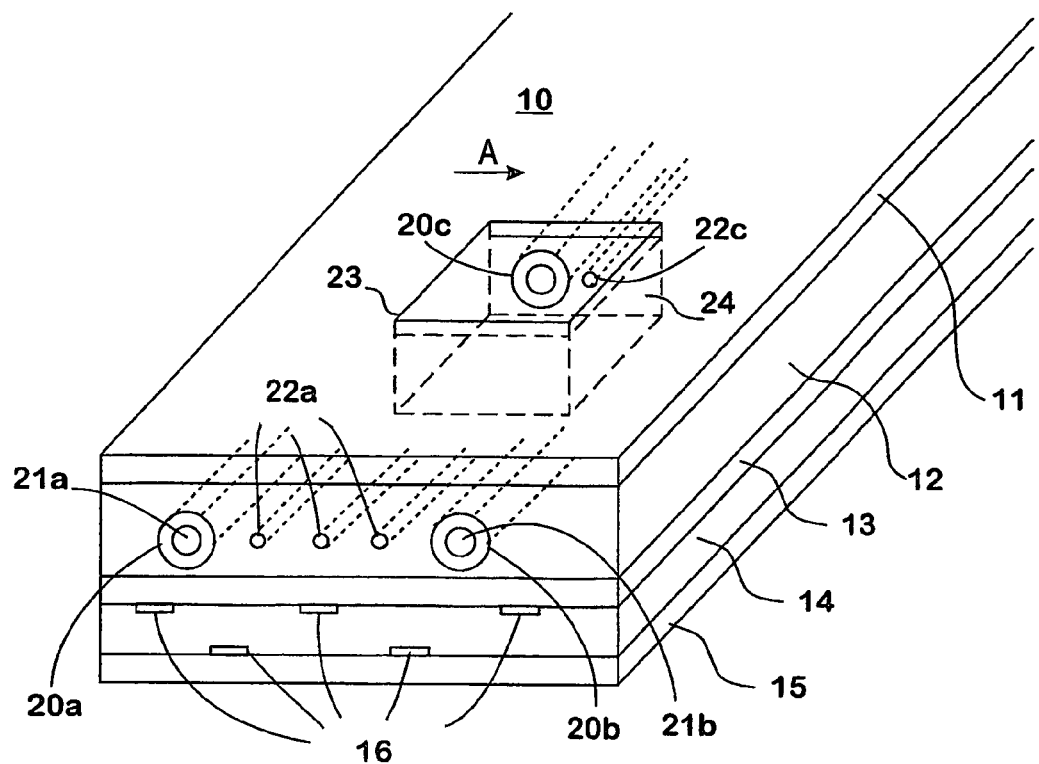
FIG. 1 shows a perspective view of a printed circuit board with embedded optical conductors.

FIG. 1 shows a printed circuit board 10 in perspective view, the representation of which is highly diagrammatic, simplified and not true to scale, for the sake of clarity.

A printed circuit board 10 is shown, which comprises several layers: a top covering layer 11, an optical layer 12, an isolating layer 13, a conductor layer 14 and a bottom layer 15. Conductor paths 16 are shown schematically in the conductor layer 14, the paths preferably being in the form of microstrip waveguides. The structure beneath isolating layer 13 therefore corresponds to known printed circuit board technology. The embodiment shown is only for illustration purposes. In particular, mostly additional compound layers and a larger number of conductor layers are provided. Other conductor paths are also provided on the covering layer and on the surface of the bottom layer 15 facing outwards. Known plated feedthrough holes are also not shown, through which conductor paths of different layers are connected to each other and are routed to the surface to terminal points.

In a first embodiment described below, optical conductors 22a, 22c have already been embedded in an optical layer 12. Possible production processes for this are known, for example in the article by B. L. Booth, Recent developments in polymer waveguide technology and applications for data link and optical interconnect systems, Proceedings of the SPIE 1996, vol. 2691, pp 2–8. A production process according to this invention will be described below, in which optical conductors with a rectangular cross-section will be used instead of optical conductors with circular cross-section as shown in FIG. 1. For example the optical conductors 22a have a thickness of 100 μm and a predetermined spacing of 300 μm from each other. According to the invention, guide elements 20a, 20b are at a similarly predetermined spacing in the optical layer and are illustrated in the shown preferred case as hollow cylinders 20a, 20b with a bore 21a, 21b. In general, instead of hollow cylinders, it is also possible to use other prismatic objects having a prismatic hollow of the same axis.

A cubic-shaped recess 23 is provided in the printed circuit board to effect the interconnection onto the optical conductors. The recess is preferably produced by a milling process, with the milling tool traveling in direction A perpendicular to the axis of the optical conductor, so that the front surface 24 pointing perpendicularly to the axis of the conductor is smooth. The area of the side surfaces of recess 23 which run alongside the optical conductors is not important, as long as the recess is adequately dimensioned.

Figure 2:
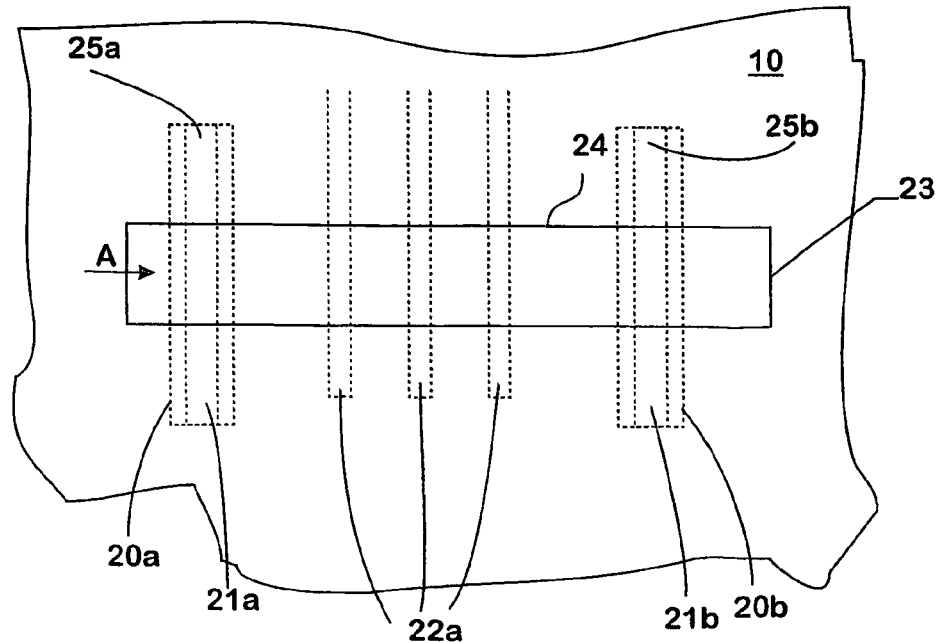
FIG. 2 shows a top view of the printed circuit board according to FIG. 1.

FIG. 2 shows a top view of the printed circuit board 10. Optical conductors 22a and hollow cylinders 20a, 20b with inner bores 21a, 21b are contained within printed circuit board 10 and are thus illustrated with dotted lines. The optical conductors extend, as shown in the figure, at least in a direction further along the surface of the printed circuit board 10. The recess 23 is produced by means of a milling tool which mills a slit into the printed circuit board in the direction of arrow A perpendicular to the direction of the fibers. In this way, the optical conductors are cut through. Bare end-faces are therefore produced on the smooth sidewall 24. At the same time, the hollow cylinders 20a, 20b are cut through, so that the openings belonging to the bores 21a, 21b, and thus blind holes 25a, 25b, are produced on the smooth end-face. The length of the hollow cylinders is such that, with respect to the positioning accuracy of the milling tool, it can be ensured that sufficiently deep blind holes are produced. In this respect either the hollow cylinders should be sealed at the ends or the embedding compound should be so viscous that it does not seep too far into the ends of the hollow cylinders. The ends of the optical conductors 22a which have been laid bare by the milling process are then be polished if necessary.

Figure 3:
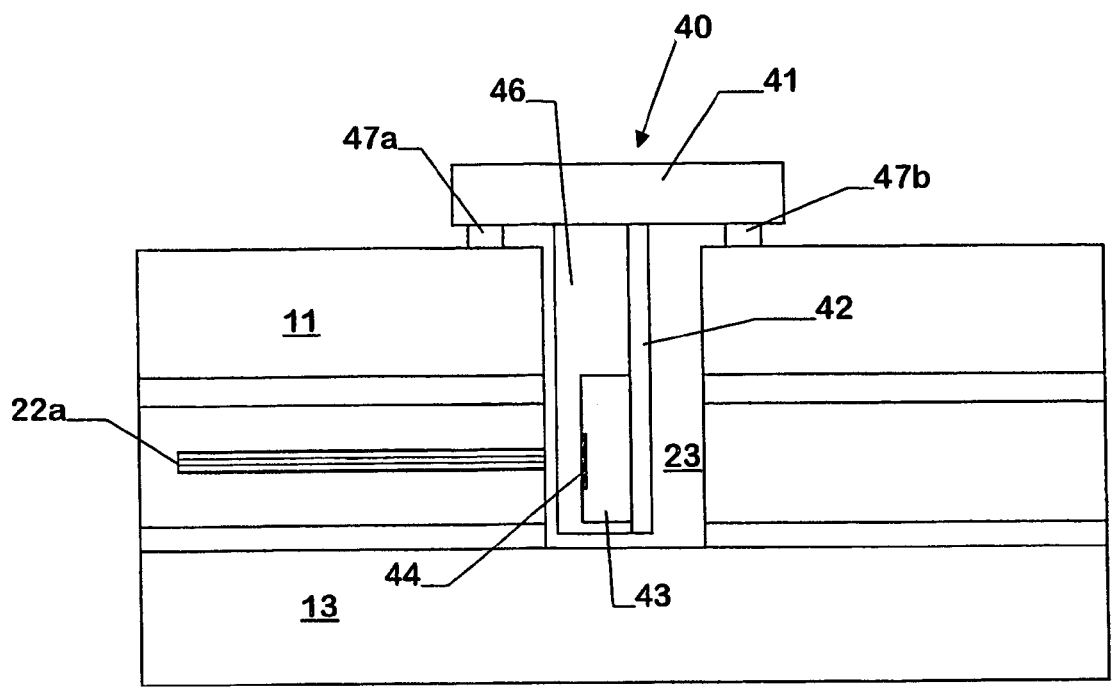
FIG. 3 shows a sectional view of a printed circuit board with an inserted coupling element.

FIG. 3 shows a section perpendicular to the printed circuit board along an optical conductor 22a. An optoelectronic converter 40 is inserted into the recess 23. This figure is also not true to scale. The thickness of the printed circuit board is approx. 2 mm and the diameter of the optical conductors is approx. 100 μm. The optoelectrical converter 40 comprises a base plate 41, which lies parallel to the surface of the printed circuit board, and a support 42 perpendicular thereto. An optical transmitter 43 (sender or receiver) is attached to the perpendicular support 42, the transmitter having an optically active surface 44. The optical transmitter 43 is preferably an integrated circuit, which is connected to bond wires which are not shown. These bond wires can either be interconnected to the support 42 or to the base plate 41.

To protect the integrated circuit 43 and the bond wires, a layer 46 is added which is preferably completely transparent. This layer has an index of refraction adjusted to the optical wavelengths, said index of refraction being for example half the index of refraction of the optical conductor 22a, to which the coupling is to take place.

On the bottom of the base plate facing the printed circuit board, solder terminals 47a, 47b are provided for surface mounting (SMD), which are only shown here in symbolic form. Moreover, for the sake of clarity, the conductor paths, to which the solder terminals 47a, 47b are connected, are not shown.

Figure 4:
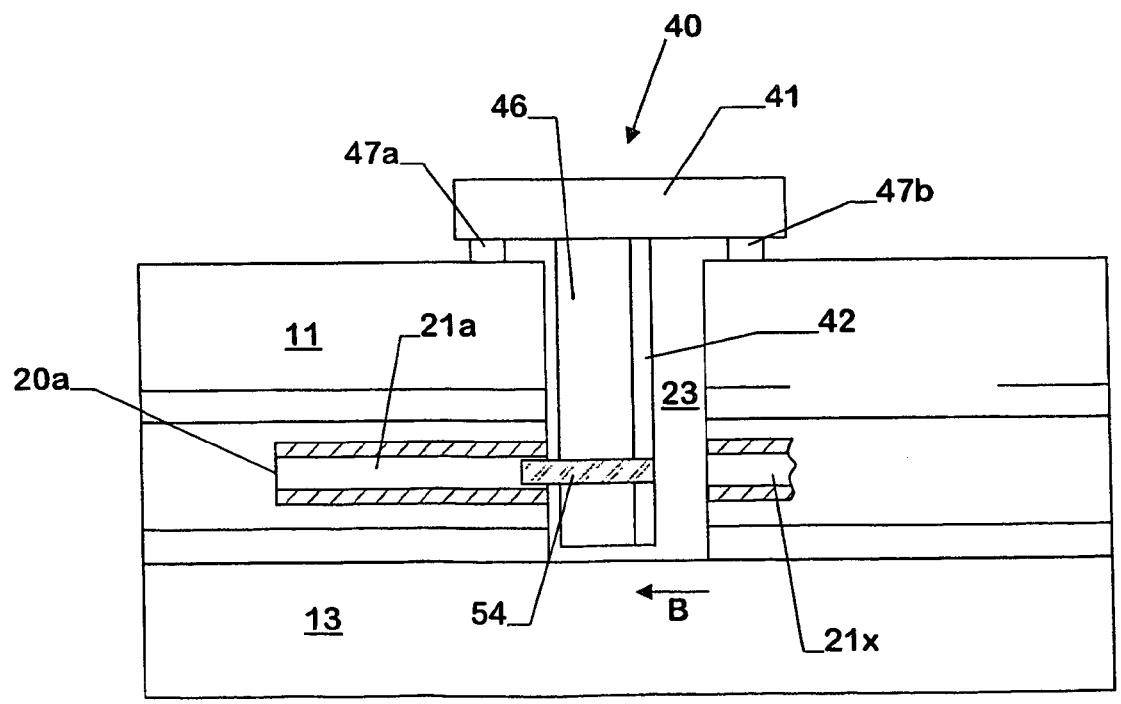
FIG. 4 shows a sectional view as in FIG. 3, but in a parallel plane thereto.

FIG. 4 shows a section parallel to the section shown in FIG. 3, but this time longitudinally to the hollow cylinder 20a. The hollow cylinder 20a is divided up in the section. The part shown is in the left-hand side of the drawing. During the production process, a residue 21x usually forms on the opposite side and this residue may remain there. A pin 54 is attached perpendicularly to the support 42, the pin fitting flush into the inner bore of the hollow cylinder 20a. The coupler 40 is inserted from above into the printed circuit board and then moved in the direction of arrow B, so that the pin 54 goes into the inner bore 21a of the hollow cylinder 20a. The position of the pin is therefore fixed in both dimensions not corresponding to the direction of arrow B. Terminal points 47a, 47b are able to support the necessary tolerances, as a connection is preferably made via soldering.

As can be seen in FIG. 1 and FIG. 2, two hollow cylinders are provided in the same level as the optical conductors, but arranged to the left and right thereof. After inserting the support, which then also has two pins, the position of the support is fixed and determined relative to the hollow cylinders. When producing the coupler 40, it is necessary to ensure that the optically active surfaces 44 of the transmitter 43 lie in a plane with the pins 54 and that the transmitters 43 have a certain spacing from the pins. Given that a relatively small component is involved which is the size of a known MT connector, it is possible to adopt the technology used in the production of MT connectors. Furthermore, when producing the printed circuit board, it is necessary to ensure that the optical conductors 22a are at the predetermined spacing from each other and from the hollow cylinders 20a, 20b.

Figure 5:
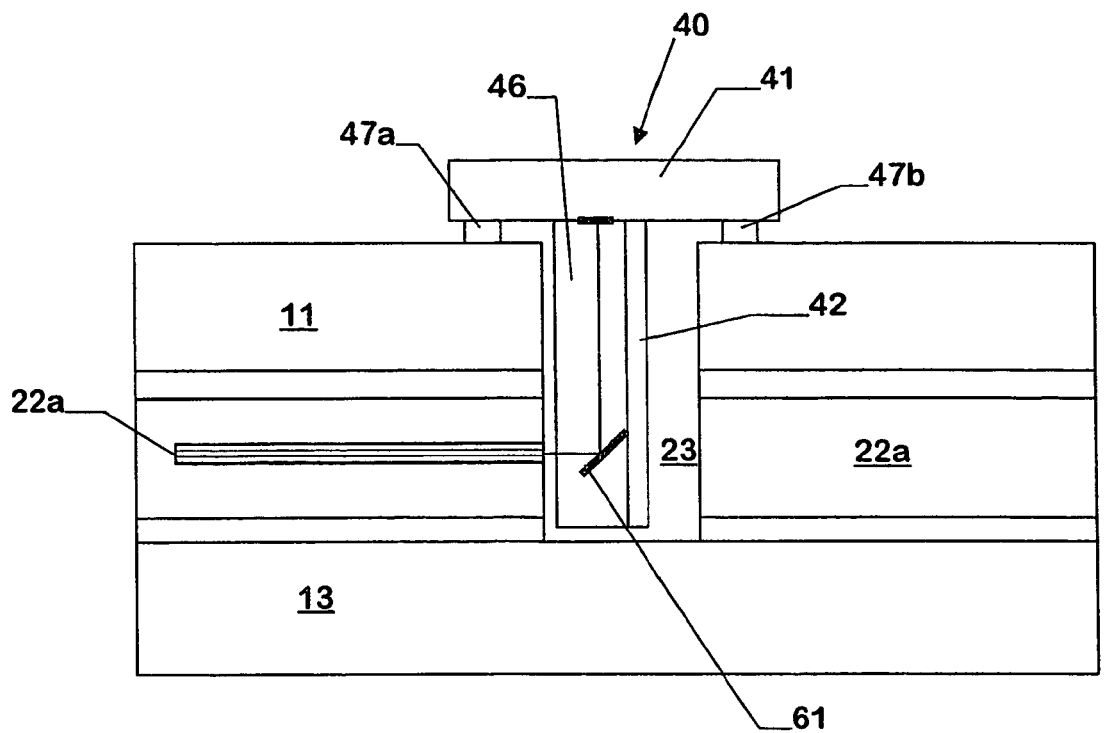
FIG. 5 shows an optical coupling as an alternative to FIG. 3.
Figure 6:
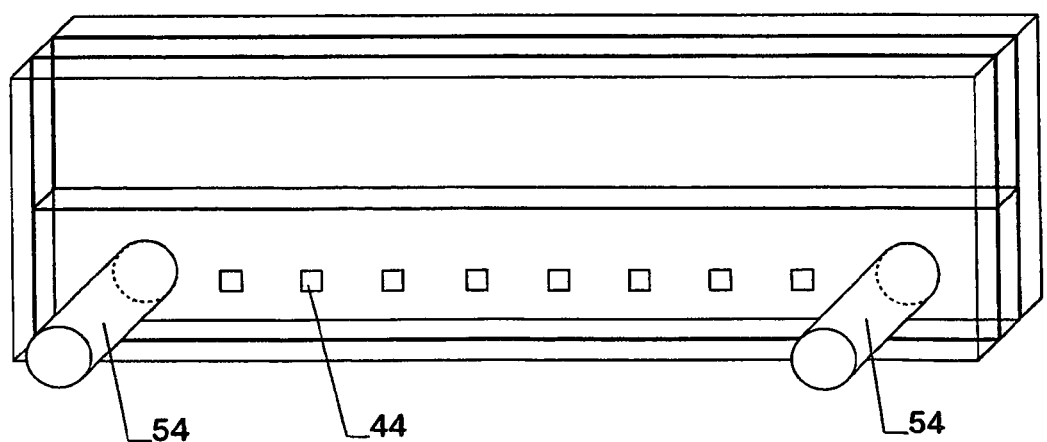
FIG. 6 shows the underneath of a coupling element in perspective view.

FIG. 5 shows an alternative arrangement, in which a mirror 61 deflects light beams emitted by the optical conductor 22a upwards and projects them onto an optical element on the base plate 41. As no connections are required for this on the support 42, this form is advantageous in this context. However, it is disadvantageous that the mirror has to be precisely aligned and that the light is no longer guided between the mirror and optical element. FIG. 6 shows a perspective view of a coupler, highlighting the guide pins 54 and the optical elements 44.

To produce the optical layers, it is possible to use a production process as shown in FIGS. 7 to 10. The figures only show the plane in which the optical conductors can be found. The other layers, in particular those with electrical conductors, have been omitted for the sake of clarity.

Initially, as shown in FIG. 7, an optical base layer 122 is produced with index of refraction $n_1$, e.g. by being cast onto a lower isolating layer 13, as shown for example in FIG. 1. Grooves 71a for the optical conductors are added in this base layer 122, either by milling, embossing, etching or another process. The relative precision of the spacing between the grooves is of decisive importance, but the absolute alignment on the printed circuit board is not. Groove sections 70a, 70b are at the same time produced at the points at which connectors are required. As shown in FIG. 8, hollow cylinders 20a, 20b are inserted or pressed into the groove sections 70a, 70b. After this, as shown in FIG. 9, the groove 71a is filled with an optically transparent compound 22a', which is suitable as an optical guide and which has an index of refraction of $n_2 > n_1$. This may be done for example by leveling out or screen-printing with subsequent smoothing of the surface before or after the optical transparent compound 22a' has hardened. The hollow cylinders are preferably inserted beforehand, so that the groove sections 70a, 70b are not contaminated by the optically transparent compound. It is possible to reverse the sequence if the application process is set up accordingly.

Alternatively (not shown), ready-produced sections of an optical conductor can be pressed into the grooves. The grooves then serve as a means of fixing the spacing from each other and from the hollow cylinders.

Additionally, according to FIG. 10, an optical covering layer 10 with an index of refraction of $n_3 < n_2$ is added. It is then possible to apply in a known process electrical conductor paths, even in multiple layers, by means of an additive or subtractive process. In this way, the optical layer is fully protected, as neither the grooves 71a nor the groove sections 70a, 70b are routed to the edge of the printed circuit board. If the electrical conductor paths including any through-connections are ready-electroplated and machined, the method described above can be followed, after a slit has been milled into the printed circuit board 10 in direction A according to FIG. 2, such that the optical conductors 22a and the hollow cylinders 20a, 20b are laid bare. It is of course possible for this slit to extend through the entire printed circuit board, so that a hole is created.

The invention claimed is:

1. A position-fixing arrangement for use in printed circuit boards, wherein inside the printed circuit board and parallel to a surface thereof, there is at least one hollow object, an inner wall of which determines a position to be fixed and the printed circuit board has a recess which is adjacent to a part of the at least one hollow object and represents an entrance in an axial direction to the inner wall, comprising a coupler which has at least one guide pin that fits flush into the at least one hollow object.

2. The arrangement according to claim 1, where the coupler has a base part mounted on the printed circuit board and a support attached perpendicularly thereto, on which the guide pins are perpendicularly positioned.

3. The arrangement according to claim 2, wherein the coupler has an electrooptical converter attached to the support.

4. The arrangement according to claim 2, wherein the coupler has an optical converter attached to the base part and coupled to the support by means of beam deflection.

5. The arrangement according to claim 2, wherein the base part has electrical terminal panels on a side of the coupler facing the printed circuit board.

* * * * *